United States Patent
Beyerlein et al.

(10) Patent No.: US 9,967,970 B2
(45) Date of Patent: May 8, 2018

(54) CIRCUIT ARRANGEMENT FOR REDUCING THE MAXIMUM ELECTRICAL FIELD STRENGTH, HIGH VOLTAGE GENERATION UNIT WITH SUCH A CIRCUIT ARRANGEMENT AND X-RAY GENERATOR WITH SUCH A HIGH VOLTAGE GENERATION UNIT

(71) Applicant: SIEMENS HEALTHCARE GMBH, Erlangen (DE)

(72) Inventors: Walter Beyerlein, Bubenreuth (DE); Richard Eichhorn, Hirschaid Seigendorf (DE); Christian Hoffmann, Nürnberg (DE); Norbert Hoffmann, Nürnberg (DE); Rashid Karimi, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days. days.

(21) Appl. No.: 15/525,237

(22) PCT Filed: Oct. 19, 2016

(86) PCT No.: PCT/EP2016/075009
§ 371 (c)(1),
(2) Date: May 8, 2017

(87) PCT Pub. No.: WO2017/089030
PCT Pub. Date: Jun. 1, 2017

(65) Prior Publication Data
US 2017/0367178 A1    Dec. 21, 2017

(30) Foreign Application Priority Data

Nov. 27, 2015 (DE) ........................ 10 2015 223 534

(51) Int. Cl.
| | |
|---|---|
| H05K 1/02 | (2006.01) |
| H05G 1/12 | (2006.01) |
| H05K 1/18 | (2006.01) |
| H05K 1/11 | (2006.01) |

(52) U.S. Cl.
CPC ............. *H05K 1/0254* (2013.01); *H05G 1/12* (2013.01); *H05K 1/111* (2013.01); *H05K 1/181* (2013.01); *H05K 2201/1003* (2013.01)

(58) Field of Classification Search
CPC ...... H05K 1/0254; H05K 1/111; H05K 1/181; H05K 2201/1003; H05G 1/12
See application file for complete search history.

(56) References Cited

U.S. PATENT DOCUMENTS 5,774,349 A * 6/1998 Tichy ................... H02M 7/103
                                                                336/200
8,155,271 B2   4/2012 Beyerlein et al.
(Continued)

FOREIGN PATENT DOCUMENTS

| CN | 1575210 A | 2/2005 |
|---|---|---|
| CN | 103855128 A | 6/2014 |

(Continued)

OTHER PUBLICATIONS

PCT International Search Report and Written Opinion of the International Searching Authority dated Feb. 3, 2017 for corresponding PCT/EP2016/075009, with English Translation.
(Continued)

*Primary Examiner* — Glen Kao
(74) *Attorney, Agent, or Firm* — Lempia Summerfield Katz LLC

(57) ABSTRACT

The disclosure specifies a circuit arrangement having electronic first components arranged on a circuit board and lying at high-voltage potential. The circuit arrangement includes functionless, electronic second components lying at high-
(Continued)

voltage potential, which are arranged on the circuit board adjacent to the electronic first components, and configured to reduce the maximum electrical field strength between the first components and a reference potential and/or between pads of the circuit board and the reference potential. Through the additional, functionless components, the maximum electrical field strength between electronic components at high voltage and at a reference potential will be reduced. The disclosure also specifies a high voltage generation unit and an x-ray generator.

20 Claims, 4 Drawing Sheets

(56) References Cited

U.S. PATENT DOCUMENTS

2004/0261251 A1  12/2004  Schindel
2006/0007624 A1* 1/2006  Sundaram ............ H05K 1/0257
                                                      361/117
2009/0039710 A1  2/2009  Beyerlein et al.
2013/0020672 A1* 1/2013  Tipton ................ H01L 23/3735
                                                      257/496
2014/0151842 A1  6/2014  Kim et al.
2016/0322971 A1  11/2016  Aubauer et al.

FOREIGN PATENT DOCUMENTS

CN    104838591 A      8/2015
DE     10227841 A1     1/2004
DE    102007032808 A1  1/2009
WO   WO2015131931 A1   9/2015

OTHER PUBLICATIONS

Chinese Office Action for related Chinese Application No. 201680003595.3 dated Dec. 11, 2017.

* cited by examiner

CIRCUIT ARRANGEMENT FOR REDUCING THE MAXIMUM ELECTRICAL FIELD STRENGTH, HIGH VOLTAGE GENERATION UNIT WITH SUCH A CIRCUIT ARRANGEMENT AND X-RAY GENERATOR WITH SUCH A HIGH VOLTAGE GENERATION UNIT

The present patent document is a § 371 nationalization of PCT Application Serial Number PCT/EP2016/075009, filed Oct. 19, 2016, designating the United States, which is hereby incorporated by reference, and this patent document also claims the benefit of DE 10 2015 223 534.3, filed Nov. 27, 2015, which is also hereby incorporated by reference.

TECHNICAL FIELD

The disclosure relates to a circuit arrangement for reducing the maximum electrical field strength created by a high voltage of first electronic components, which are arranged on a printed circuit board and lie at high-voltage potential, and to a high voltage generation unit with such a circuit arrangement.

BACKGROUND

With a circuit arrangement, in which electronic components lie at high voltage in relation to a reference potential (e.g., ground), high electrical field strengths occur between the electronic components and the reference potential. An "electronic component" is to be understood below as an "electronic or electrical component".

High-voltage circuit arrangements are used in x-ray generators, for example. To generate x-ray radiation, x-ray generators need an acceleration voltage, which is present as a unipolar (e.g., maximum + or −150 kV) or bipolar (e.g., symmetrical maximum −75 and +75 kV) voltage between the anode and the cathode. The high-voltage generation chain of the x-ray generator (e.g., radio-frequency or multi-pulse generator) includes, as depicted in FIG. 1, a mains power input 1, a parallel-tuned or resonant circuit inverter 2, and a high voltage generation unit 3, which provides an x-ray emitter 4 with the necessary high voltage.

High voltage generation units 3 may have an oil-filled vessel, in which one or more high-voltage transformers 5, a single-stage or multistage (e.g., cascade) rectifier circuit 6, an element for damping transient processes (e.g., resistive or inductive) and a measuring divider for determining the high voltage are arranged. Modern high voltage generators 3 have circuits that make possible a combined rectification and multiplication of the high voltage (e.g., Villard, Greinacher, Delon circuit).

The known circuits are not designed for use at high-voltage potential. If metallic tips, corners, or edges are present in high-voltage components, high field strengths will be created locally, which may exceed the electrical strength values of the surrounding insulating media. If this is the case, undesired discharges, flashovers, or sparkovers may be initiated from these points, which may lead to anything from a brief operational outage to the failure of the high voltage generator of the x-ray generator.

The published patent DE 10 2007 032 808 A1 discloses solutions for reducing the electrical field strength and adapting the parasitic capacitances of high-voltage components. In particular, it is proposed that two conducting or conductive plates be arranged at an angle to the diode chain of the high voltage generation unit on the circuit board.

SUMMARY

The scope of the present disclosure is defined solely by the appended claims and is not affected to any degree by the statements within this summary. The present embodiments may obviate one or more of the drawbacks or limitations in the related art.

The object of the disclosure is to specify a circuit arrangement, a high voltage generation unit and an x-ray generator that reduce the maximum electrical field and thus improve the probability of there not being an outage.

In accordance with the disclosure, additional electronic components are arranged on the circuit board adjacent to electronic components, which lie at high-voltage potential, are short circuited and through their location in the vicinity of the electronic component, reduce the maximum electrical field strength between the electronic components and a reference potential. "Adjacent" refers to at a distance of less than ten millimeters.

The physical variable electrical field strength describes the strength and direction of an electrical field, e.g., the capability of this field to exert force on charges. An electrical field strength occurs between points of different electrical potential.

A circuit arrangement is provided with electronic first components, which are arranged on a circuit board and lie at high-voltage potential. The arrangement also has function-less, electronic second components lying at high-voltage potential, which are arranged on the circuit board adjacent to the electronic first components and reduce the maximum electrical field strength between the first components and a reference potential and/or between solder surfaces of the circuit board and the reference potential.

Through the additional, functionless components the maximum electrical field strength between electronic components at high voltage and a reference potential will be reduced.

In a development of the circuit arrangement the second components may be short-circuited.

In a further embodiment, the second components may be arranged at points at which the maximum electrical field strength occurs.

In one embodiment, the first and the second components may be surface mount device (SMD) components.

In a further version, the first components may be diodes and/or the second components may be capacitors.

In a further embodiment, the reference potential may be a chassis ground.

In a further embodiment, the second components may be arranged in the shape of the circle arc segment.

Furthermore, the circuit arrangement may have vias lying at high-voltage potential in the circuit board adjacent to the second components. The field reduction will be further improved by this.

In a development, solder surfaces on the circuit board for contacting the first components may be fully covered by the first components, through which the field control will be further improved.

The disclosure also relates to a high voltage generation unit with at least one high-voltage transformer and a circuit arrangement for rectification of a high voltage electrically connected to the high-voltage transformer.

In addition, the disclosure also relates to an x-ray generator with a resonant circuit inverter and a high voltage generation unit.

BRIEF DESCRIPTION OF THE DRAWINGS

Further special features and advantages of the disclosure will become apparent from the explanations given below of a number of exemplary embodiments based on schematic diagrams.

DETAILED DESCRIPTION

The disclosure is to be described by way of example for a diode module of a high voltage generation unit. The diode module is responsible for the rectification of the high voltage.

Solder surfaces (also referred to as pads) with thicknesses in the range of 35 μm on the circuit boards are used for contacting of electronic components. The pads may have sharp metallic edges, which may be responsible for high-voltage discharges. The internal structure of diodes and their contacts includes, inter alia, cost-optimized punched parts in the millimeter range with microscopic tips and edges, which for their part may have high tolerances. The geometries of the pads for the components are predetermined by the SMD technology, so that sharp-edged structures arise on the pads and on the diodes, which, with high electrical voltages, lead to discharges in the insulation system in relation to a reference potential.

In a field simulation by finite element method (FEM) of the electrical field strength on a model of a printed circuit board with diodes, it was clear that at the edges of the diodes or at the sides of the pads a maximum electrical field strength of around 23 kV/mm may occur.

Figure 1:
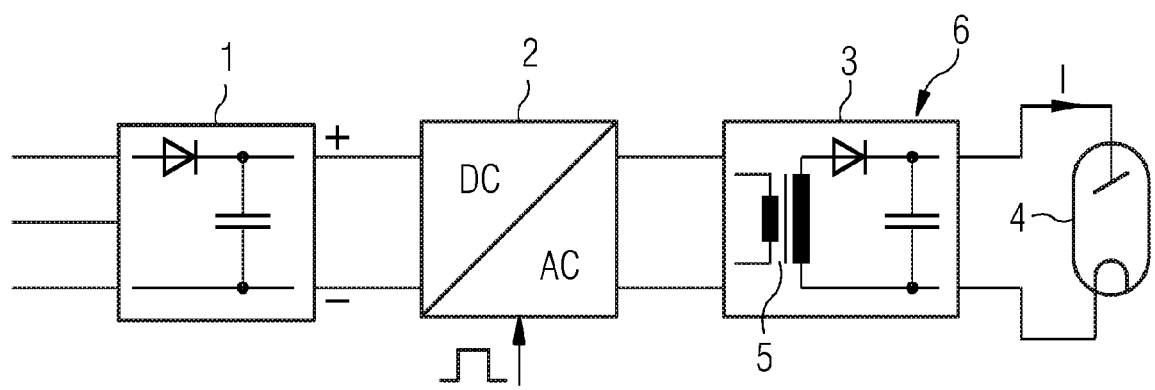
FIG. 1 depicts a circuit arrangement of an x-ray generator in accordance with the prior art.
Figure 2:
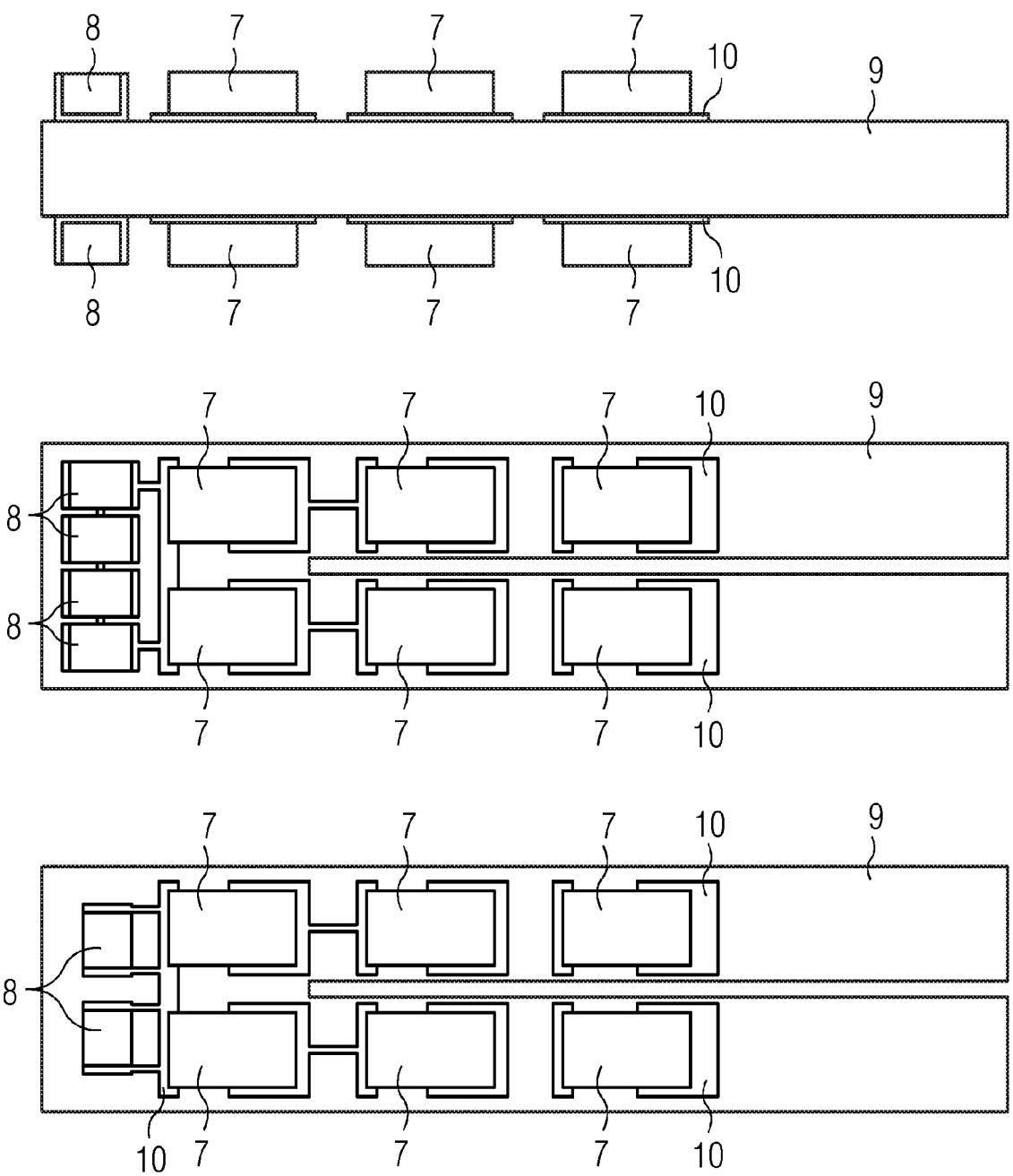
FIG. 2 depicts an example of a circuit arrangement with field-controlling components.

FIG. 2 depicts how, with an SMD circuit board with diodes 7 (=electronic first components) for rectification, which will be operated at high-voltage potential, a field control (=reduction of the maximum electrical field strength) may be undertaken in a low-cost and space-saving manner.

At the top, FIG. 2 depicts a cross-section through a circuit board 9 with diodes 7 and shows the associated view from above in the middle. For field control, in addition to the diodes 7, four electronic second components 8, (e.g., capacitors), without any function with selected geometries for field control will be attached at the critical points on the circuit board 9 adjacent to the diodes 7. In certain examples, the capacitors or resistors in the SMD sizes (e.g., 1210, 1206, 0805, 0603 . . . ) are attached on the end face side to the last diodes 7. Depicted at the bottom in FIG. 2 is a view from above with two second components 8, which are likewise arranged on the end face side.

Capacitors of size 0805 (length=2.0 mm, width=0.8 mm, height=1.25 mm) are shown to be especially advantageous, because these have large metallic terminals, which serve to homogenize the electrical field. The second components 8, as required, may be attached as a chain or individually laterally or on the end face side in relation to the surroundings. The second components 8 do not have any function and are short-circuited.

Multi-layer ceramic capacitors (MLCC) are especially suitable as a result of their internal structure for lateral fitting. The metallic surfaces to increase the internal capacitance assume the potential of the two contacts and thus homogenize the electrical field.

In addition, the field control may be improved with pads 10 hidden in relation to the surroundings, in that the first components (e.g., diodes 7) protrude somewhat and thus cover the sharp edges of the pads 10.

Figure 3:
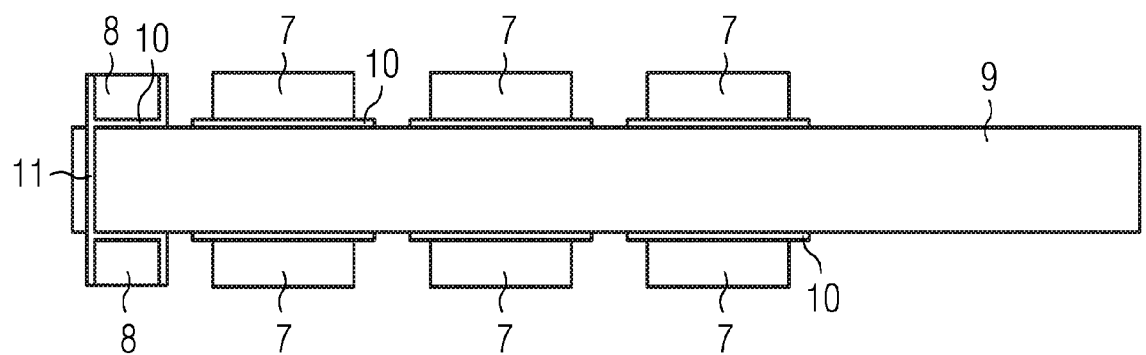
FIG. 3 depicts an example of a circuit arrangement with field-controlling components and field-controlling vias.

FIG. 3 depicts a circuit module with a circuit board 9 in cross-section, in which, in addition to the components 8 and the diodes 7, vias 11 are provided on the outer pads 10. The vias 11 have an additional field-controlling effect.

Figure 4:
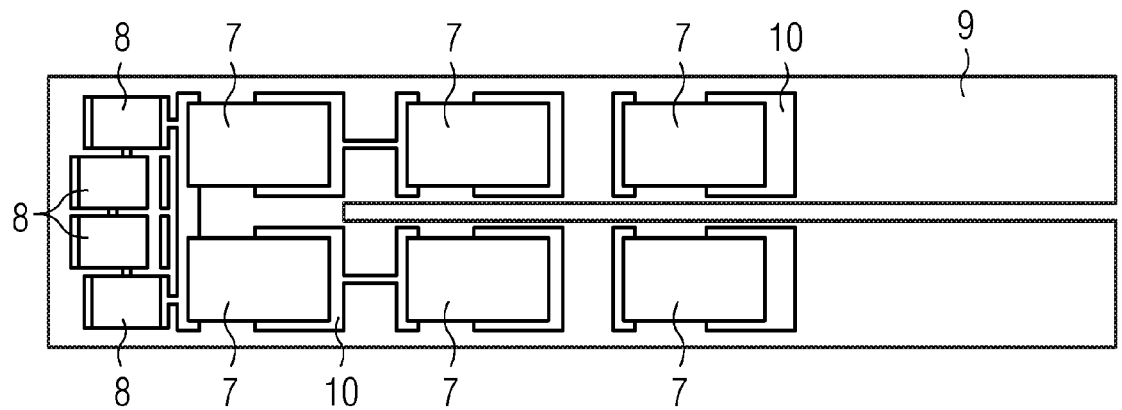
FIG. 4 depicts an example of a circuit arrangement with field-controlling components arranged in a circular arc.

FIG. 4 depicts a view from above of a circuit module with diodes 7 and second components 8 on a circuit board 9, in which the field-controlling second components 8 are arranged in a circular arc on the end-face side. This emulates a curvature, which reduces the maximum electrical field strength even further.

Figure 5:
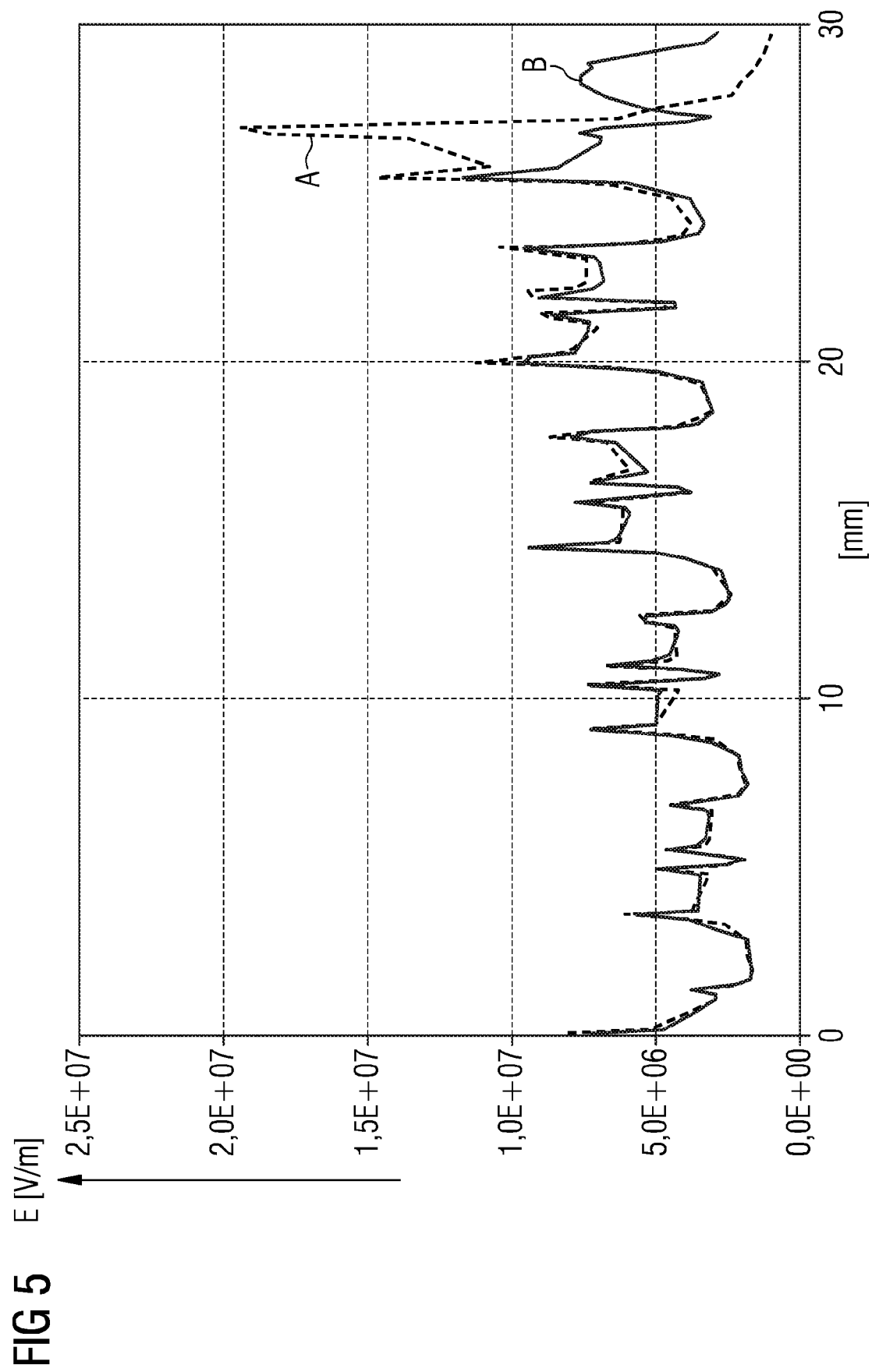
FIG. 5 depicts an example of a graph of the electrical field strength.

In FIG. 5, in a graph, the field control effect is depicted by way of example using a model of a series of diodes with 3×5 diodes arranged in parallel, wherein all diodes will be operated at a potential of +15 kV. The critical distance to a chassis wall at ground potential amounts to 25 mm in the model. The graph shows the first curve A, which shows the electrical field strength E along the diode series without field-reducing second components.

If five second components (e.g., without moving the SMD diodes) are attached to the diode series on the end-face side similar to the circuit arrangement in FIG. 2 and set to the identical high-voltage potential +15 kV, the graph of the electrical field strength E shown by the second curve B is produced. Along the diode series identical field strengths E will be achieved, while in the area of the last diode, adjacent to the second components, a reduction of the maximum field strength in relation to the surroundings of around 40% (e.g., 12 kV/mm instead of 19 kV/mm) will be achieved.

Although the disclosure has been illustrated and described in detail by the exemplary embodiments, the disclosure is not restricted by the disclosed examples and the person skilled in the art may derive other variations from this without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A circuit arrangement comprising:
electronic first components arranged on a circuit board and lying at high-voltage potential; and functionless, electronic second components lying at high-voltage potential,
wherein the electronic second components are arranged on the circuit board adjacent to the electronic first components, and
wherein the electronic second components are configured to reduce a maximum electrical field strength between the electronic first components and a reference potential and/or between pads of the circuit board and the reference potential.

2. The circuit arrangement of claim 1, wherein the electronic second components are short-circuited.

3. The circuit arrangement of claim 2, wherein the electronic second components are arranged at points on the circuit board where the maximum electrical field strength occurs.

4. The circuit arrangement of claim 3, wherein the electronic first components and the electronic second components are surface mount device components.

5. The circuit arrangement of claim 4, wherein the electronic first components are diodes.

6. The circuit arrangement of claim 5, wherein the reference potential is a chassis ground.

7. The circuit arrangement of claim 6, wherein the electronic second components are capacitors.

8. The circuit arrangement of claim 1, wherein the electronic second components are arranged at points on the circuit board where the maximum electrical field strength occurs.

9. The circuit arrangement of claim 1, wherein the electronic first components and the electronic second components are surface mount device components.

10. The circuit arrangement of claim 1, wherein the electronic first components are diodes.

11. The circuit arrangement of claim 10, wherein the electronic second components are capacitors.

12. The circuit arrangement of claim 1, wherein the reference potential is a chassis ground.

13. The circuit arrangement of claim 1, wherein the electronic second components are capacitors.

14. The circuit arrangement of claim 13, wherein the electronic second components are arranged in a shape of a circular arc.

15. The circuit arrangement of claim 1, wherein the electronic second components are arranged in a shape of a circular arc.

16. The circuit arrangement of claim 1, further comprising:
vias lying at high-voltage potential in the circuit board adjacent to the electronic second components.

17. The circuit arrangement of claim 16, further comprising:
the pads embodied on the circuit board for contacting the electronic first components, wherein the pads are completely covered by the electronic first components.

18. The circuit arrangement of claim 1, further comprising:
the pads embodied on the circuit board for contacting the electronic first components, wherein the pads are completely covered by the electronic first components.

19. A high voltage generation unit comprising:
at least one high-voltage transformer having a circuit arrangement for rectifying a high voltage connected to the at least one high-voltage transformer, wherein the circuit arrangement comprises:
electronic first components arranged on a circuit board and lying at high-voltage potential; and
functionless, electronic second components lying at high-voltage potential, wherein the electronic second components are arranged on the circuit board adjacent to the electronic first components, and wherein the electronic second components are configured to reduce a maximum electrical field strength between the electronic first components and a reference potential and/or between pads of the circuit board and the reference potential.

20. An x-ray generator comprising:
a parallel-tuned inverter; and
a high voltage generation unit comprising a high-voltage transformer, the high-voltage transformer having a circuit arrangement for rectifying a high voltage connected to the high-voltage transformer, wherein the circuit arrangement comprises:
electronic first components arranged on a circuit board and lying at high-voltage potential; and
functionless, electronic second components lying at high-voltage potential, wherein the electronic second components are arranged on the circuit board adjacent to the electronic first components, and wherein the electronic second components are configured to reduce a maximum electrical field strength between the electronic first components and a reference potential and/or between pads of the circuit board and the reference potential.

* * * * *